United States Patent [19]

Ziemer

[11] Patent Number: 5,221,847
[45] Date of Patent: Jun. 22, 1993

[54] BREAK-BEFORE-MAKE CONTROL FOR FORM C SOLID-STATE RELAYS WITH CURRENT LIMITER BYPASS

[75] Inventor: Craig B. Ziemer, Earl Township, Lancaster County, Pa.

[73] Assignee: AT&T Bell Laboratories, Murray Hill, N.J.

[21] Appl. No.: 905,060

[22] Filed: Jun. 26, 1992

[51] Int. Cl.$^5$ .................. H01J 40/14; G02B 27/00; H03K 3/42
[52] U.S. Cl. ..................... 250/551; 307/311
[58] Field of Search ............ 250/551, 214 R, 214 C, 250/238, 214 SW; 307/311

[56] References Cited

U.S. PATENT DOCUMENTS

| | | | |
|---|---|---|---|
| 4,227,098 | 10/1980 | Brown et al. | 307/311 |
| 4,464,605 | 8/1984 | Ford, Jr. et al. | 250/551 |
| 4,714,827 | 12/1987 | Akita | 250/214 C |
| 4,754,175 | 6/1988 | Kobayashi et al. | 250/551 |
| 4,859,875 | 8/1989 | Tihanyi et al. | 307/311 |
| 4,902,901 | 2/1990 | Pernyeszi | 250/551 |
| 4,912,335 | 3/1990 | Ehalt et al. | 250/551 |
| 4,916,323 | 4/1990 | Hayashi et al. | 250/551 |
| 5,013,926 | 5/1991 | Aizawa | 250/551 |
| 5,043,587 | 8/1991 | Miki et al. | 250/551 |
| 5,057,694 | 10/1991 | Idaka et al. | 250/551 |
| 5,105,090 | 4/1990 | Miyajima et al. | 250/551 |
| 5,138,177 | 8/1992 | Morgan et al. | 250/551 |
| 5,146,100 | 9/1992 | Banaska | 250/551 |

Primary Examiner—David C. Nelms
Assistant Examiner—Michael Messinger
Attorney, Agent, or Firm—Scott W. McLellan

[57] ABSTRACT

A solid-state relay with delayed turn-on time without substantially increasing the time to bring the relay to full conduction after the delay. A current limiter disposed in series with photodiode array limits current therefrom to delay turn-on until the gate voltage of the output transistors is approximately the threshold voltage thereof. Once the threshold voltage is reached, the current limiter is bypassed so that the photodiode array provides full current to quickly turn-on the output transistors.

12 Claims, 2 Drawing Sheets

BREAK-BEFORE-MAKE CONTROL FOR FORM C SOLID-STATE RELAYS WITH CURRENT LIMITER BYPASS

BACKGROUND OF THE INVENTION

1. Field of the Invention

This invention relates to solid-state relays in general and, more particularly, to solid-state relays with multiple sections, such as single-pole, double-throw (Form C) relays.

2. Description of the Prior Art

The reliability, speed, quietness, and efficiency of solid-state relays make them an attractive alternative to mechanical (electromechanically operated) relays. As a result, solid-state relays have significantly displaced mechanical relays in low and medium power applications. More particularly, both normally-open (form A) and normally-closed (form B) single pole relays have found wide application. However, single-pole, double-throw (SPDT or form C) solid-state relays have not found wide application to date, compared to their mechanical equivalent. One advantage of the form C mechanical relay over the form C solid-state relay is the mechanical relay's ability to be configured to operate reliably as either make-before-break or break-before-make. Similarly, double (or more) form A or form B solid-state relays whose sections operate in delayed synchronism are also difficult manufacture with reliable section timing.

A major reason for the form C (or multisection form A or multisection form B) solid-state relay's inability to operate reliably as a break-before-make (or make-before-break) relay is the difficulty of reliably delaying the operation of one section of the relay with respect to the other section(s) thereof.

SUMMARY OF THE INVENTION

It is one aspect of the invention to provide a solid-state relay with controlled operation delay.

Another aspect of the invention is to provide a solid-state relay with controlled operation delay without substantially increasing the time to bring the relay to full conduction after the delay.

These and other aspects of the invention may be accomplished generally in a solid-state relay having one or more sections, at least one section having: an output transistor, having a gate, a source, and a drain, the drain connecting to an output terminal of the relay; and a generator, coupled to the gate and source of the transistor, for selectively biasing the gate with respect to the source thereof in response to a control signal. The relay is characterized by: a current limiter, disposed in series with the generator, for limiting current from the generator to a predetermined amount; and, a means for bypassing the current limiter. The means bypasses the current limiter in response to the control signal after a predetermined delay.

The invention may also be accomplished generally in a solid-state relay having at least one section, the section having: an output transistor, having a gate, a source, and a drain, the drain connecting to an output terminal of the relay; and a generator, coupled to the gate and source of the transistor, for selectively biasing the gate with respect to the source thereof in response to a control signal. The invention is characterized by a method for delaying the actuation of the relay by the steps of: limiting current from the generator to a reduced current with a current limiter; and removing the current limit in response to the control signal after a predetermined delay.

BRIEF DESCRIPTION OF THE DRAWING

The foregoing features of this invention, as well as the invention itself, may be more fully understood from the following detailed description of the drawings, in which.

DETAILED DESCRIPTION

Figure 3:
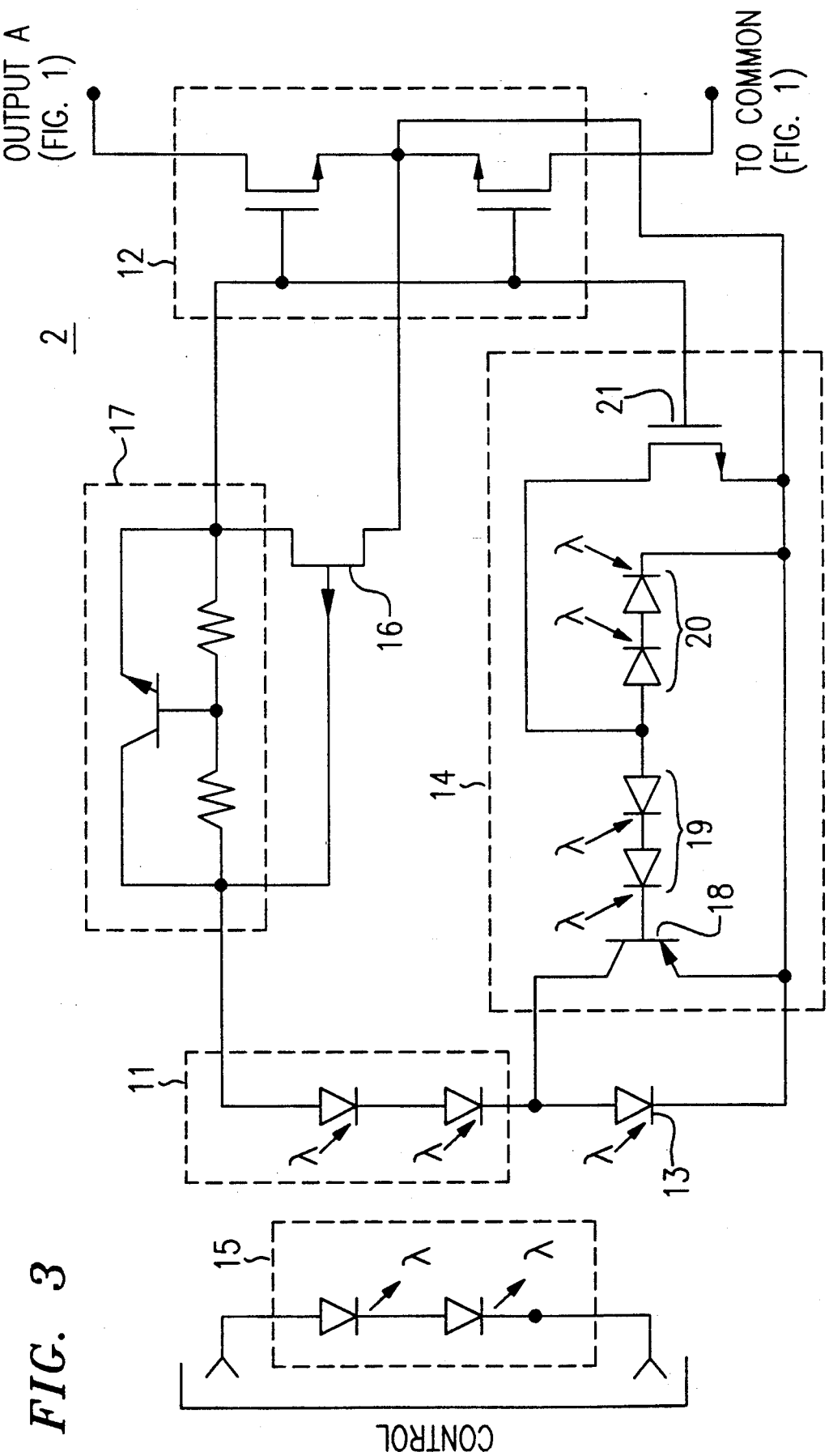
FIG. 3 is a simplified schematic diagram of an exemplary embodiment of the invention.

A summary of the invention as it pertains to an exemplary embodiment of the invention, shown in FIG. 3, is given herein. A solid-state relay 2 has a photodiode generator 11 and an output transistor arrangement 12. A current limiter 13 limits current from the generator 11. A means 14 bypasses the current limiter 13 after a predetermined delay and before the conductivity of relay 2 begins to substantially change. Then full current from the generator 11 is applied and the conductivity of relay rapidly changes.

Figure 1:
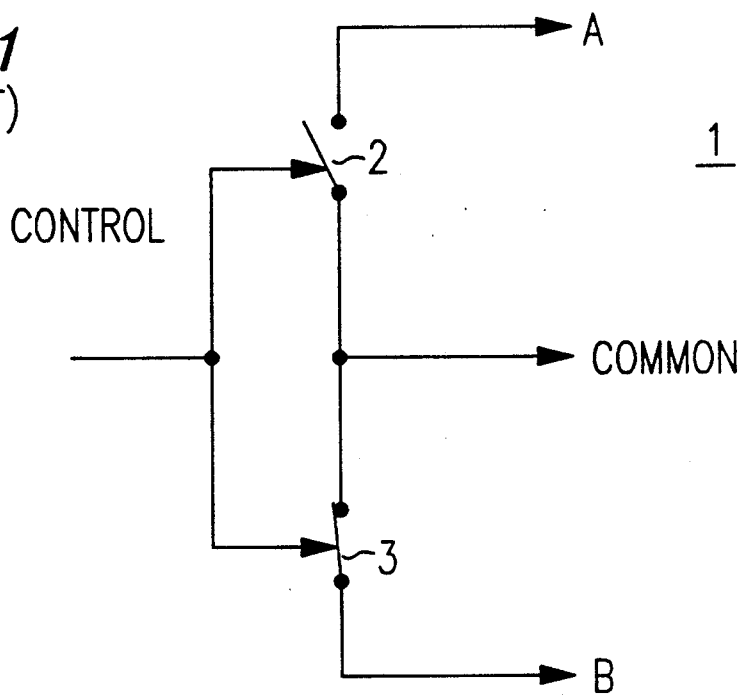
FIG. 1 is a simplified schematic diagram of a single pole, double throw (SPDT or form C) relay.

More generally, an exemplary multi-section relay 1, such as a form C relay, is shown in FIG. 1. A common control signal (not numbered) controls the operation of both relays 2, 3, coupling to outputs A and B, respectively, and to a common output COMMON. In the illustrative example, the relay 1 has a normally-open section 2 and a normally-closed section 3. Exemplary section 2 is described in U.S. Pat. No. 4,227,098. An example of section 3 is shown in U.S. Pat. No. 5,138,177, assigned to the same assignee as this invention, incorporated herein by reference.

For many applications, the relay 1 should be break-before-make; at no time should there be a conduction path between the output terminals A and B of the relay 1. Guaranteeing that the sections 2, 3 are not simultaneously closed can be problematic.

Figure 2:
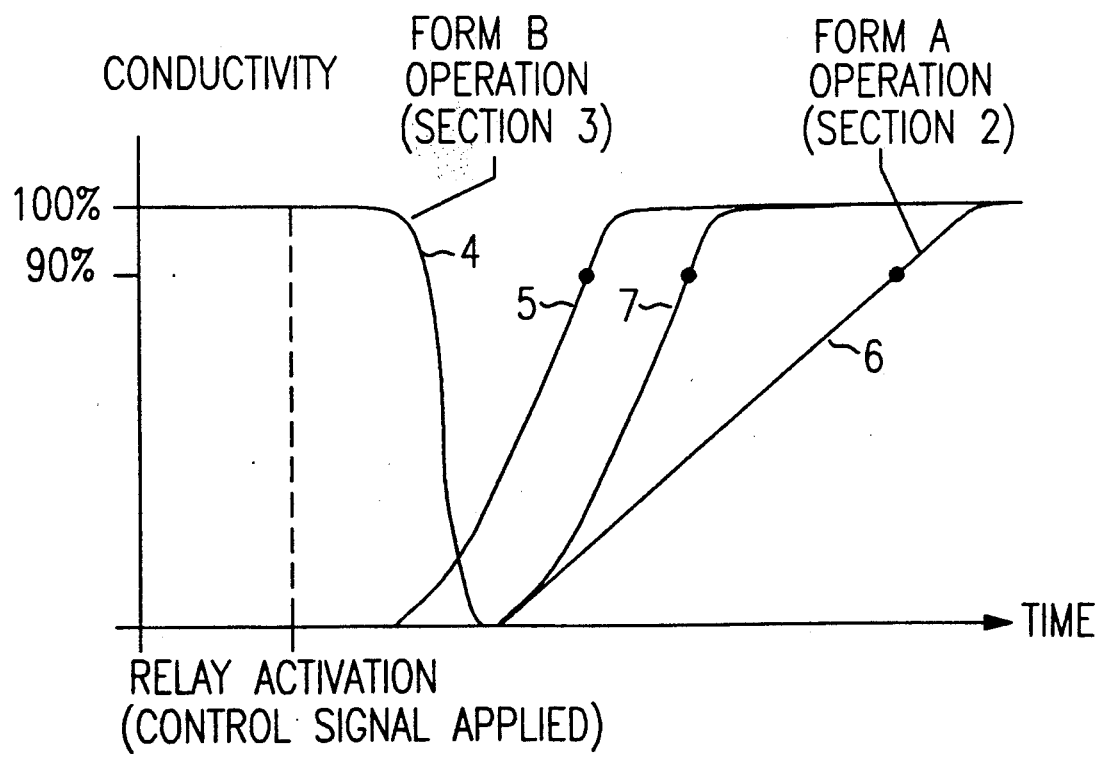
FIG. 2 is a illustrative diagram (not to scale) of the operation of a form C relay upon actuation.

In FIG. 2, the conductivity of the exemplary relay sections 2, 3 (FIG. 1) is plotted when the control signal thereto is applied, i.e., when the relay 1 is actuated. When the control signal is applied, the form B section 3 begins to "open" by reducing conductivity, as shown by curve 4. As discussed above, using a conventional form A relay section 2, the conductivity of the section 2 will begin to conduct before the section 3 substantially stops conducting, as shown by curve 5, forming an unwanted conduction path between terminals A and B (FIG. 1). As will be discussed below, merely slowing down the entire turn-on process of the section 2 may result in the curve 6. This may be considered unsatisfactory for many applications because the rate of change in conductivity (as illustrated by the slope of the curve 6) is too slow and the time from the control signal application to full conductivity (as measured to the 90% conductivity level) of the section 2 is too long.

In FIG. 3, an exemplary form A section 2 is shown with circuitry which delays the operation (turn-on) of the section 2 without substantially increasing the time to bring the section 2 to full conduction after the delay. Alternatively, the exemplary form A section 2 can be thought of as having a delay from the time of control signal application to the onset of conductivity without substantially reducing the rate of change in conductivity of the section 2. Like a conventional form A relay, the section 2 has a photodiode array 11 of series-coupled photodiodes responsive to an optical control signal generated by an array of light emitting diodes 15. Current from the photodiode array 11 charges the gate capacitance of MOS output transistors 12 (as well as other parasitic capacitances). When sufficient charge is accumulated on the gates of the transistors 12, the transistors 12 are "turned-on", turning-on the section 2. JFET 16 and voltage dropping circuit 17 (a $V_{be}$ multiplier) help speed the turn-off of the section 2 when the control signal is removed. Additionally, the circuit 17 speeds the turn-on of the section 2 by dropping a substantially fixed voltage over a relatively wide range of current from the photodiode array 11.

One conventional approach to slowing the turn-on of the conventional relay section 2 is by adding capacitance to the gates of the transistors 12. While the time from control signal application to the onset of conductivity of the section 2 is delayed, the rate of change in conductivity is also slowed, as illustrated by curve 6 in FIG. 2. As discussed above, this may not be satisfactory for many applications.

To provide a delay without significantly increasing the rate of change in conductivity, I have added a current limiter 14, here a photodiode 13 substantially identical to the diodes in array 11 but with partial shading (not shown) from the optical control signal produced by the LED array 15. It is understood that, for purposes here, the photodiodes act as current sources controlled by the intensity of the optical control signal. The amount of current which photodiode 13 passes is substantially determined by the amount of shading from the optical control signal. Alternatively, the photodiode 13 may be a high value resistor of several megaohms. Bypass circuit 14, bypasses the current limiting diode 13 when the voltage on the gates of the output transistors 12 substantially reach the threshold voltage thereof, as will be explained in more detail below.

The bypass circuit 14 has therein a bipolar transistor 18, biasing photodiodes 19, 20, and a sensing transistor 21. The gate and source terminals of sensing transistor 21 is disposed in parallel with the gate and sources of transistors 12. Sense transistor 21 has substantially the same threshold voltage ($V_t$) as the output transistors 12. Thus, the conductivity of transistor 12 mirrors the conductivity of the transistors 12. When transistor 21 conducts sufficiently, photodiodes 19, 20 forward-bias transistor 18, causing transistor 18 to bypass the current limiting photodiode 13, as will be discussed in more detail below.

EXEMPLARY OPERATION

When the optical control signal is first applied, illuminating photodiodes 11, 13, 19, and 20, photodiode array 11 produces current to charge the capacitances of the gates of transistors 12 and 21. Sense transistor 21 is not conducting, thus the voltage on the base of transistor 18 is substantially zero (the voltages from photodiodes 19 and 20 substantially canceling out each other). As discussed above, the current from the array 11 is limited by current limiting photodiode 13.

With time, the limited current from array 11 charges the gate capacitances of transistors 12, 21 until the threshold voltage thereof (all being substantially equal) is reached. For purposes here, this is considered the onset of conductivity for the section 2, as discussed above. This causes transistor 21 to conduct sufficiently to bypass photodiodes 20 so that photodiodes 19 forward bias transistor 18 into sufficient conduction to effectively bypass current limiting photodiode 13. Then the full current from array 11 charges the gate capacitances of transistors 12, 21 rapidly into full conduction, similar in rate of change in conductivity as in prior art relays. Thus, the turn-on or operation of the relay section 2 is delayed while the time to bring the section 2 into full conduction after the delay is not substantially longer than that in prior art relays. The amount of current passed by the current limiting photodiode 13 sets the delay of the section 2 and may be varied by changing the amount of current passed by the photodiode 13.

EXEMPLARY VALUES

The following approximate and exemplary component values were used to make a form C section 2 having a delay of one millisecond:

photodiode array 11: 24—180×180 μm isolated diodes, $I_{max} \approx 2$ μA transistors 12: 600×2000 μm, $V_t \approx 2.5$ V, with integral diodes photodiode 13: 180×180 μm, $I_{max} \approx 0.5$ μA $V_{be}$ multiplier: dropping voltage ≈ 4 V transistor 18: PNP bipolar transistor, $h_{FE} \approx 10$ photodiodes 19, 20: 2 each 180×180 μm transistor 21: 100×150 μm, $V_t \approx 2.5$ V It is understood that the above-described invention may be applied to the form B section 3 (FIG. 1) as well.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. In a solid-state relay having one or more sections, at least one section having:

an output transistor, having a gate, a source, and a drain, the drain connecting to an output terminal of the relay; and a generator, coupled to the gate and source of the transistor, for selectively biasing the gate with respect to the source thereof in response to a control signal; characterized by:

a current limiter, disposed in series with the generator, for limiting current from the generator to a predetermined amount; and a means for bypassing the current limiter;

wherein the means bypasses the current limiter in response to the control signal after a predetermined delay.

2. The relay as recited in claim 1, further characterized the bypassing means shunts the current limiter to allow substantially full current from the generator to flow.

3. The relay as recited in claim 2, wherein the output transistor has a predetermined threshold voltage and the bypassing means is further characterized by:

a sense transistor having a gate, a source, and a drain, the gate and source being paralleled with the gate and source of the output transistor, the sense transistor having substantially the same threshold voltage as the output transistor; and a switch, responsive to the sense transistor, for bypassing the current limiting means when the transistor conducts;

wherein the predetermined delay is substantially determined by time for the reduced current from the generator to charge capacitance of the gate of the output transistor and the sense transistor and other parasitic capacitance.

4. The relay as recited in claim 3, wherein the generator is an array of series-coupled photodiodes responsive to an optical control signal.

5. The relay as recited in claim 4, wherein the current limiter is a photodiode, substantially the similar as a photodiode in the array of photodiodes, having a portion thereof shaded from the optical control signal.

6. The relay as recited in claim 5, wherein the bypassing means is further characterized by a plurality of photodiodes, responsive to the optical control signal, for providing sufficient electrical energy to power the switch.

7. The relay as recited in claim 4, wherein the current limiter is a resistor.

8. The relay as recited in claim 4, wherein the optical control signal is provided by a series of light emitting diodes.

9. In a solid-state relay having at least one section, the section having:

an output transistor, having a gate, a source, and a drain, the drain connecting to an output terminal of the relay; and a generator, coupled to the gate and source of the transistor, for selectively biasing the gate with respect to the source thereof in response to a control signal;

a method for delaying the actuation of the relay, characterized by the steps of:

limiting current from the generator to a reduced current with a current limiter; and removing the current limit in response to the control signal after a predetermined delay.

10. The method as recited in claim 9, wherein the output transistor has a predetermined threshold voltage, and further characterized by the step of:

sensing the voltage on the gate of the output transistor; and bypassing the current limiter when the gate voltage is substantially equal to the threshold voltage of the output transistor.

11. The method as recited in claim 10, wherein the sensing of the gate voltage is by a sense transistor, having a gate and source in parallel with the gate and source of the output transistor, the threshold voltage of the sense transistor being substantially the same as the output transistor; wherein the predetermined delay is substantially determined by time for the reduced current from the generator to charge capacitance of the gate of the output transistor and the sense transistor and other parasitic capacitance.

12. The method as recited in claim 11, wherein the generator is an array of photodiodes responsive to an optical control signal.

* * * * *